United States Patent
Ryu et al.

(10) Patent No.: US 8,904,629 B2
(45) Date of Patent: Dec. 9, 2014

(54) LIGHT-EMITTING DIODE (LED) WAFER PICKER

(75) Inventors: In Hwan Ryu, Ansan-si (KR); Hak Pyo Lee, Ansan-si (KR); Il Chan Yang, Ansan-si (KR); Ho Joong Lee, Seoul (KR)

(73) Assignees: LG CNS Co. Ltd., Seoul (KR); Robostar Co., Ltd., Ansan-si (KR)

( * ) Notice: Subject to any disclaimer, the term of this patent is extended or adjusted under 35 U.S.C. 154(b) by 35 days.

(21) Appl. No.: 13/415,982

(22) Filed: Mar. 9, 2012

(65) Prior Publication Data

US 2013/0234194 A1     Sep. 12, 2013

(51) Int. Cl.
*B23P 19/00* (2006.01)

(52) U.S. Cl.
USPC .................................. 29/743; 29/740; 294/65

(58) Field of Classification Search
USPC ............. 29/740–743, 832; 294/188, 65, 86.4; 414/752.2–752.7
See application file for complete search history.

(56) References Cited

U.S. PATENT DOCUMENTS

| | | | | |
|---|---|---|---|---|
| 5,029,383 A | * | 7/1991 | Snyder et al. | 29/740 |
| 5,882,055 A | * | 3/1999 | Smith | 414/752.1 |
| 6,099,597 A | * | 8/2000 | Yap et al. | 29/25.01 |
| 6,502,808 B1 | * | 1/2003 | Stone et al. | 269/21 |
| 7,665,783 B2 | * | 2/2010 | Nishio | 294/188 |
| 7,793,408 B2 | * | 9/2010 | Oh | 29/743 |
| 7,958,628 B2 | * | 6/2011 | Lee et al. | 29/832 |

\* cited by examiner

*Primary Examiner* — Minh Trinh
(74) *Attorney, Agent, or Firm* — Darrell L. Pogue; Keohane & D'Alessandro PLLC

(57) ABSTRACT

A light-emitting diode (LED) wafer picker that may increase a suction force and may perform stable adsorption without a concern for contact with a top surface of an LED wafer is provided. An LED wafer picker may include a main body to hold, in an adsorbed state, an LED wafer disposed below the main body, when air drawn in from a top of the LED wafer picker is discharged along a streamlined discharge surface to both sides of the LED wafer picker, a guide member to enable the air to flow along the discharge surface, the guide member being disposed below the discharge surface, a single central hole formed in a central portion of the guide member, excluding a portion facing the discharge surface, and a support portion to support the LED wafer, the support portion extending downward from the guide member. Accordingly, it is possible to easily perform adsorption of an LED wafer that is relatively far from the LED wafer picker. Additionally, it is possible to prevent the top surface of the LED wafer from coming into contact with the guide member, thereby reducing detects due to contamination of foreign substances.

2 Claims, 6 Drawing Sheets ent invention provides a light-emitting
LIGHT-EMITTING DIODE (LED) WAFER PICKER

TECHNICAL FIELD

The present invention relates to a light-emitting diode (LED) wafer picker, and more particularly, to an LED wafer picker for holding an LED wafer in an adsorbed state using air without being in contact with the LED wafer, to transfer the LED wafer.

BACKGROUND

In general, sapphire wafers are used to manufacture light-emitting diodes (LEDs) and the like. To transfer such an LED wafer, a picker to pick up the LED wafer may be used.

A conventional LED wafer picker creates predetermined vacuum by drawing air, and fixes an LED wafer. However, since such a vacuum adsorption scheme enables the LED wafer to come into direct contact with an adsorption pad, foreign substances attached to the adsorption pad may contaminate a surface of the LED wafer, or damage the LED wafer.

To solve the above problems, a non-contact type LED wafer picker may be used. The non-contact type LED wafer picker may not come into contact with the surface of the LED wafer, based on the Bernoulli's principle. A conventional non-contact type LED wafer picker may enable compressed air to quickly flow along a streamlined discharge surface, so that an LED wafer may be held in an adsorbed state at a predetermined distance from the discharge surface.

FIG. 1 is a diagram illustrating a cross section of a conventional LED wafer picker, FIG. 2 is a diagram illustrating a bottom of the conventional LED wafer picker, and FIG. 3 is a diagram illustrating an example of an operation of the conventional LED wafer picker.

In FIGS. 1 through 3, the conventional LED wafer picker may include a main body 110, and a guide member 120.

The main body 110 may have a structure in which air is drawn in from a top of the main body 110 and is discharged toward a bottom of the main body 110. In this instance, the air may flow out to both sides along a streamlined discharge surface 111 in the bottom of the main body 110.

The guide member 120 may be disposed below the discharge surface 111, and may guide the air so that the air may flow along the discharge surface 111. The guide member 120 may include a plurality of fine holes 121 through which air flows.

Specifically, since highly compressed air drawn in from the top of the main body 110 may quickly flow along the streamlined discharge surface 111, a central portion of the discharge surface 111 may be temporally maintained in a vacuum state. Accordingly, negative pressure may be generated in an upward direction from the bottom of the main body 110, so that an LED wafer 199 (FIG. 3) disposed below the main body 110 may be held in an adsorbed state through the fine holes 121 of the guide member 120.

However, in the conventional LED wafer picker, a suction force required to adsorb the LED wafer 199 is reduced due to the fine holes 121 of the guide member 120.

Additionally, when the LED wafer 199 is held in the adsorbed state, there is concern that a top surface of the LED wafer 199 may come into contact with the guide member 120. When the top surface of the LED wafer 199 comes into contact with the guide member 120, various foreign substances may be attached to the top surface of the LED wafer 199 and, accordingly, defects may occur.

SUMMARY

An aspect of the present invention provides a light-emitting diode (LED) wafer picker that increases a suction force and performs stable adsorption without a concern for contact with a top surface of an LED wafer.

According to an aspect of the present invention, there is provided an LED wafer picker including: a main body to hold, in an adsorbed state, an LED wafer disposed below the main body, when air drawn in from a top of the LED wafer picker is discharged along a streamlined discharge surface to both sides of the LED wafer picker; a guide member to enable the air to flow along the discharge surface, the guide member being disposed below the discharge surface; a single central hole formed in a central portion of the guide member, excluding a portion facing the discharge surface; and a support portion to support the LED wafer, the support portion extending downward from the guide member.

An inclined taper may be formed in a lower end of the support portion to have a gradually decreasing diameter toward the lower end of the support portion.

The main body may include a sensor hole that is formed in the main body within a range of a diameter of the central hole and into which a sensor is inserted.

According to another aspect of the present invention, there is provided an LED wafer picker including: a main body to hold, in an adsorbed state, an LED wafer disposed below the main body, when air drawn in from a top of the LED wafer picker is discharged along a streamlined discharge surface to both sides of the LED wafer picker; a guide member to enable the air to flow along the discharge surface, the guide member being disposed below the discharge surface; a single central hole formed in a central portion of the guide member, excluding a portion facing the discharge surface; and a support portion to support the LED wafer, the support portion extending laterally from the guide member.

An inclined taper may be formed in the support portion to have a gradually decreasing diameter toward a lower end of the support portion.

The guide member may be integrally coupled to the main body.

According to embodiments of the present invention, a light-emitting diode (LED) wafer picker may increase a suction force due to a central hole formed in a guide member and accordingly, may easily perform adsorption of an LED wafer that is relatively far from the LED wafer picker.

Additionally, according to embodiments of the present invention, in an LED wafer picker, a support portion may be formed in a guide member, and a taper may be formed in the support portion, and thus it is possible to prevent a top surface of an LED wafer from coming into contact with the guide member, thereby reducing detects due to contamination of foreign substances.

Furthermore, according to embodiments of the present invention, an LED wafer picker may be formed integrally with a guide member, and thus it is possible to reduce costs and a total quantity of parts, and possible to facilitate maintenance due to a simple structure.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
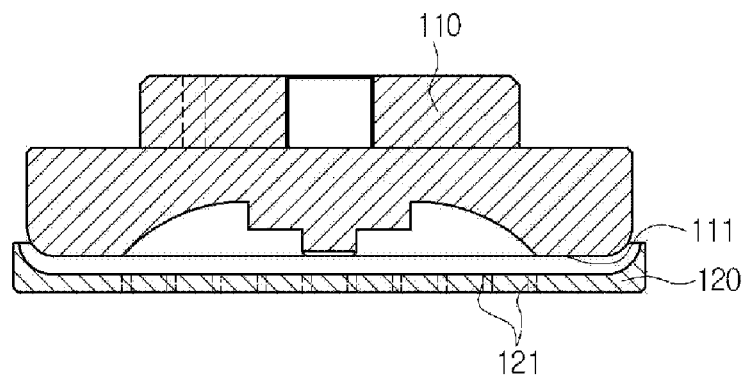
FIG. 1 is a diagram illustrating a cross section of a conventional prior-art light-emitting diode (LED) wafer picker.
Figure 2:
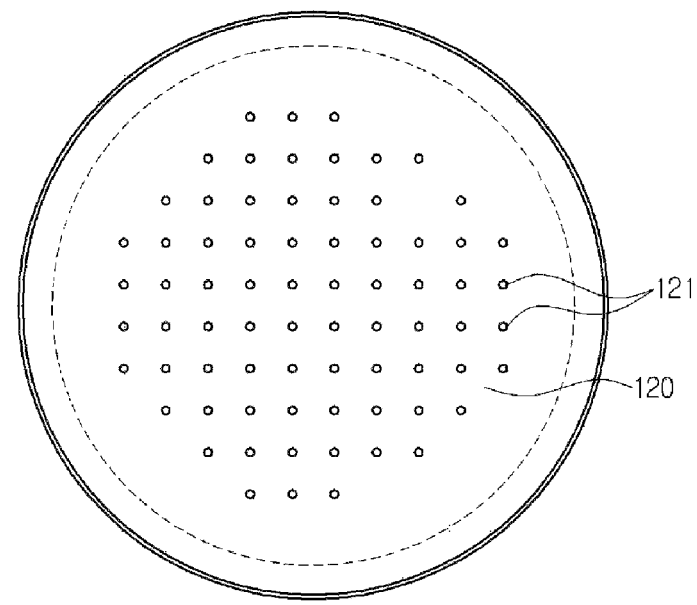
FIG. 2 is a diagram illustrating a bottom of the conventional prior-art LED wafer picker.
Figure 3:
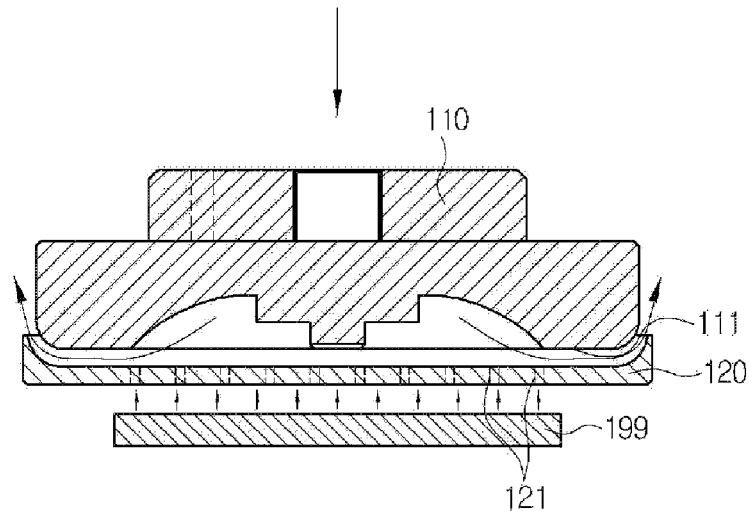
FIG. 3 is a diagram illustrating an example of an operation of the conventional prior-art LED wafer picker.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Hereinafter, a technical configuration of a light-emitting diode (LED) wafer picker will be described in detail based on the accompanying drawings.

Figure 4:
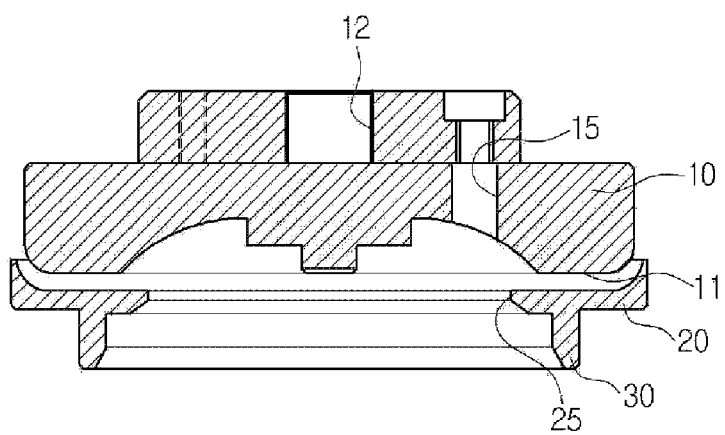
FIG. 4 is a diagram illustrating a cross section of an LED wafer picker according to an embodiment of the present invention.
Figure 5:
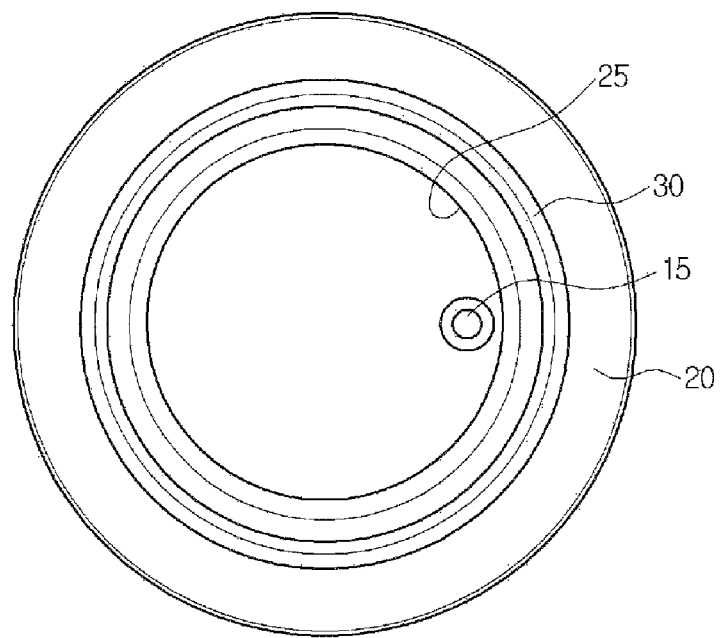
FIG. 5 is a diagram illustrating a bottom of the LED wafer picker of FIG. 4.
Figure 6:
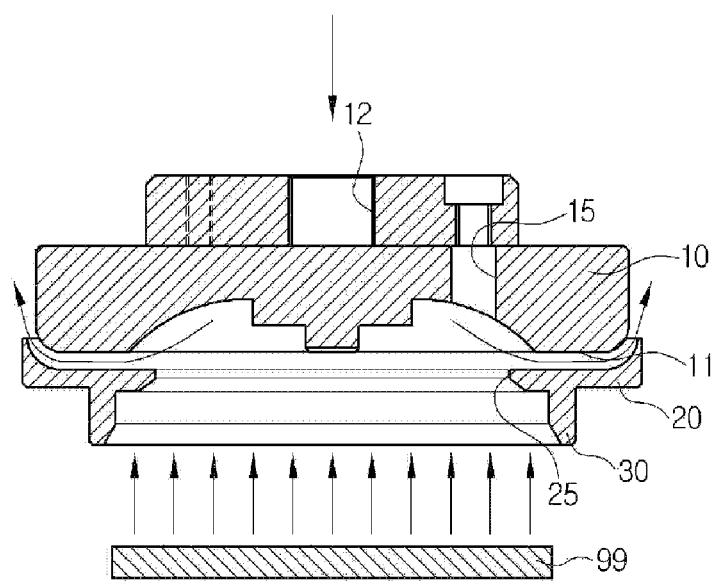
FIG. 6 is a diagram illustrating an example of an operation of the LED wafer picker of FIG. 4.
Figure 7:
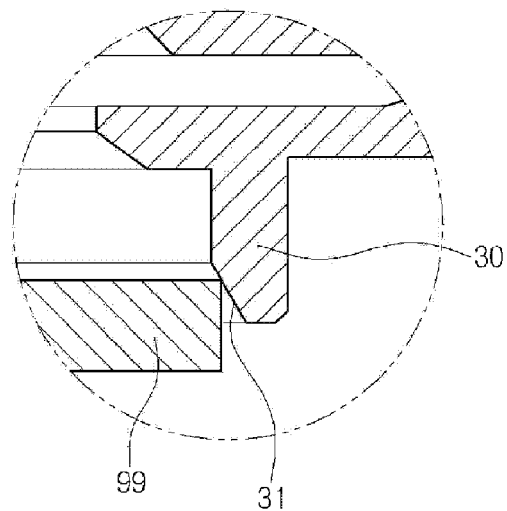
FIG. 7 is a diagram illustrating an enlarged support portion of the LED wafer picker of FIG. 4.

FIG. 4 is a diagram illustrating a cross section of an LED wafer picker according to an embodiment of the present invention, and FIG. 5 is a diagram illustrating a bottom of the LED wafer picker of FIG. 4. FIG. 6 is a diagram illustrating an example of an operation of the LED wafer picker of FIG. 4, and FIG. 7 is a diagram illustrating an enlarged support portion of the LED wafer picker of FIG. 4.

In FIGS. 4 through 7, the LED wafer picker may include a main body 10, and a guide member 20.

The main body 10 may hold, in an adsorbed state, an LED wafer 99 disposed below the main body, when air drawn in from a top of the main body 10 is discharged along a streamlined discharge surface 11 to both sides of the LED wafer picker. In other words, an inlet 12 may be formed in an upper portion of the main body 10, and may supply highly compressed air. The inlet 12 may be connected to a hose, a pipe, and the like.

The guide member 20 may be disposed below the discharge surface 11, and may guide the air so that the air may flow along the discharge surface 11.

The discharge surface 11 formed in the bottom of the main body 10 may have a streamlined cross section. The compressed air supplied via the inlet 12 may be discharged to a lower portion of the main body 10. The discharged air may quickly flow along the streamlined discharge surface 11, so that vacuum may be temporally created in a central portion of the main body 10.

Due to the vacuum created in the central portion of the main body 10, negative pressure may be generated in an upward direction, namely, a direction that enables the LED wafer 99 below the main body 10 to be adsorbed toward the main body 10.

In this instance, a single central hole 25 may be formed in a central portion of the guide member 20, excluding a portion facing the discharge surface 11. In other words, a diameter of the central hole 25 may not exceed a circumference of the portion facing the discharge surface 11. For example, when a picker enabling adsorbing of an LED wafer of 50 mm is used, the central hole 25 may desirably have a diameter of 40 mm.

Due to the single central hole 25 formed in the central portion of the guide member 20, a suction force may be increased by at least two-times, compared to a conventional structure in which a plurality of fine holes are formed. Thus, it is possible to easily hold, in the adsorbed state, an LED wafer that is spaced apart by a distance of 5 mm to 10 mm from a bottom of the guide member 20.

In this instance, the compressed air discharged to the lower portion of the main body 10 and flowing along the discharge surface 11 may be enabled to be discharged again toward the upper portion of the main body 10. This is because foreign substances around the LED wafer 99 may be scattered by the compressed air flowing down toward the LED wafer 99, and may be attached to the LED wafer 99, which may cause defects.

Additionally, the LED wafer picker of FIG. 4 may include a support portion 30 disposed below the guide member 20. The support portion 30 may extend downward from the guide member 20, and may support the LED wafer 99.

The support portion 30 may have a cylindrical shape based on the center of the guide member 20, and may correspond to a size of the LED wafer 99, as shown in FIG. 4. Additionally, a plurality of support portions may be formed in a circumferential direction of the LED wafer 99, to support the LED wafer 99 at a plurality of spots.

Additionally, the main body 10 may include a sensor hole 15 into which a sensor is inserted. The sensor hole 15 may be formed in the main body 10 within a range of the diameter of the central hole 25.

As shown in FIG. 7, an inclined taper 31 may be formed in a lower end of the support portion 30 to have a gradually decreasing diameter toward the lower end of the support portion 30.

The LED wafer 99 may come into contact with the taper 31 and accordingly, a top surface of the LED wafer 99 may be prevented from coming into contact with the guide member 20. Thus, it is possible to prevent a defect from occurring due to a scratch that may be caused by foreign substances attached to the top surface of the LED wafer 99.

The guide member 20 may be integrally coupled to the main body 10. Accordingly, a total number of parts in the LED wafer picker of FIG. 4 may be reduced, and the LED wafer picker of FIG. 4 may be simplified, and thus it is possible to facilitate maintenance of the LED wafer picker of FIG. 4 and to reduce manufacturing costs.

In other words, in the LED wafer picker of FIG. 4, the suction force may be approximately doubled due to the central hole 25 formed in the central portion of the guide member 20. Additionally, the support portion 30 including the taper 31 in a lower portion of the guide member 20 may prevent the guide member 20 from coming into contact with the top surface of the LED wafer 99.

Since the support portion 30 extends downward from the guide member 20, the LED wafer picker of FIG. 4 may be advantageously applied to an LED wafer with a relatively small size of about 2 inches (namely, 50 mm)

Figure 8:
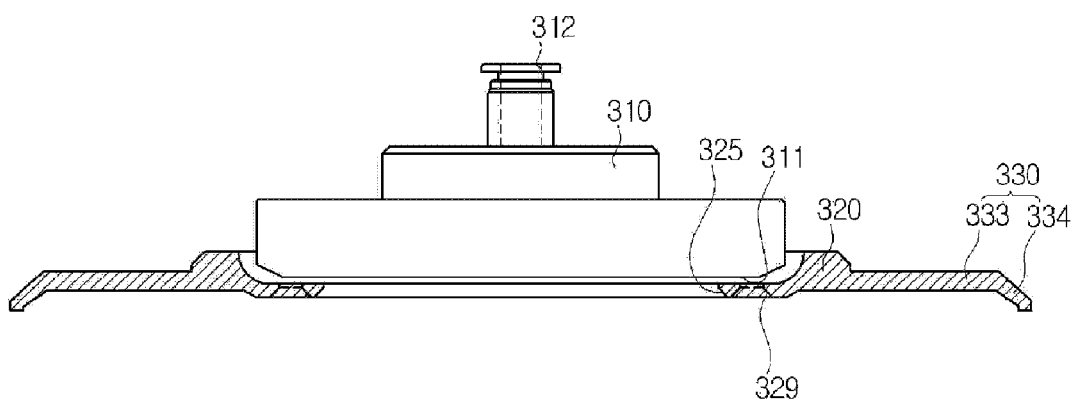
FIG. 8 is a diagram illustrating a cross section of an LED wafer picker according to another embodiment of the present invention.
Figure 9:
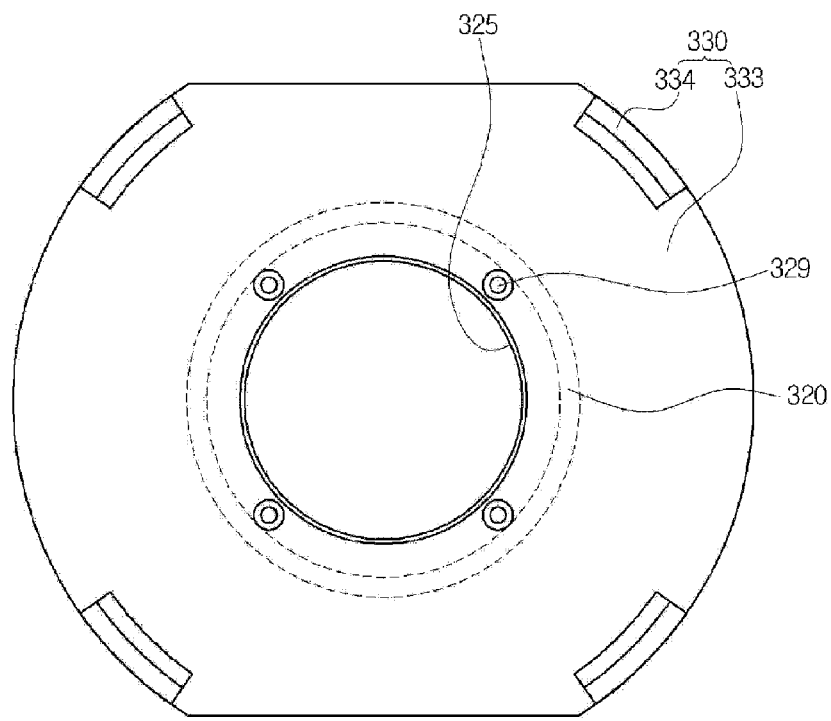
FIG. 9 is a diagram illustrating a bottom of the LED wafer picker of FIG. 8.
Figure 10:
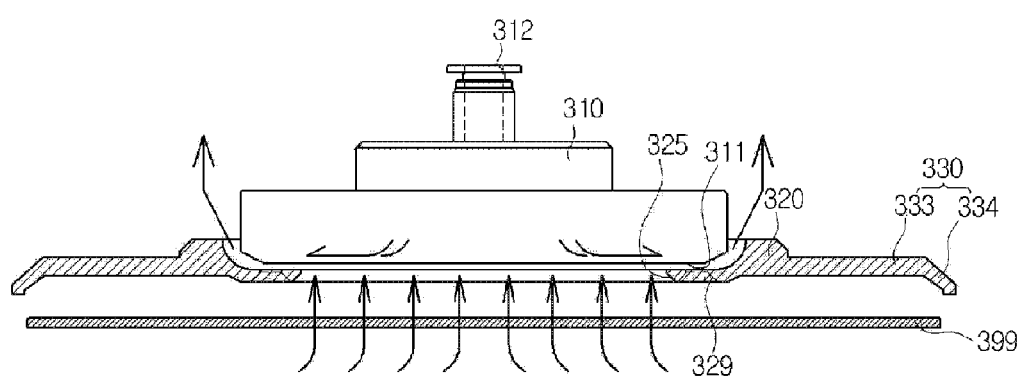
FIG. 10 is a diagram illustrating an example of an operation of the LED wafer picker of FIG. 8.
Figure 11:
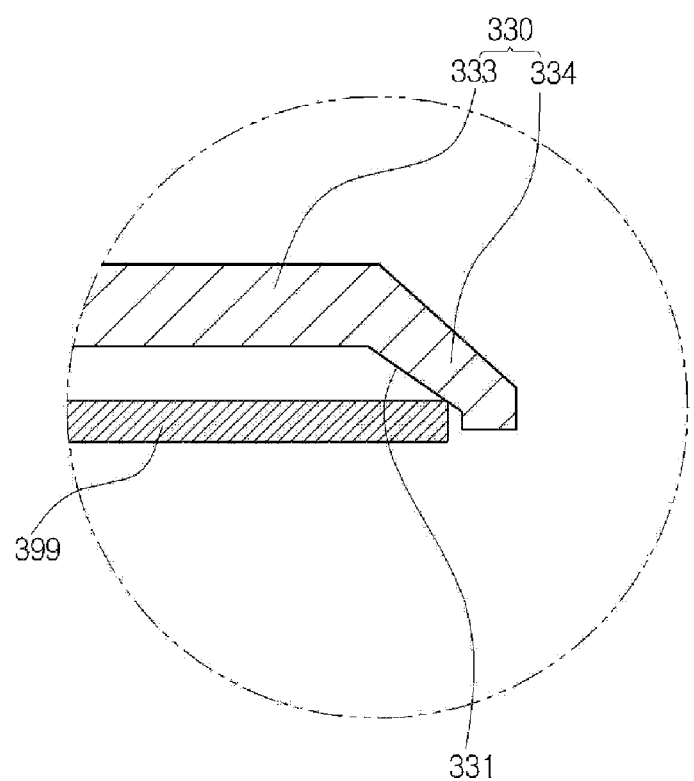
FIG. 11 is a diagram illustrating an enlarged support portion of the LED wafer picker of FIG. 8.

FIG. 8 is a diagram illustrating a cross section of an LED wafer picker according to another embodiment of the present invention, and FIG. 9 is a diagram illustrating a bottom of the LED wafer picker of FIG. 8. FIG. 10 is a diagram illustrating an example of an operation of the LED wafer picker of FIG. 8, and FIG. 11 is a diagram illustrating an enlarged support portion of the LED wafer picker of FIG. 8.

In FIGS. 8 through 11, the LED wafer picker may include a main body 310, and a guide member 320.

The main body 310 may hold, in an adsorbed state, an LED wafer 399 (FIGS. 10 and 11) disposed below the main body, when an air drawn in from a top of the main body 310 is discharged along a streamlined discharge surface 311 to both sides of the LED wafer picker. In other words, an inlet 312 may be formed in an upper portion of the main body 310, and may supply highly compressed air. The inlet 312 may be connected to a hose, a pipe, and the like.

The guide member 320 may be disposed below the discharge surface 311, and may guide the air so that the air may flow along the discharge surface 311.

The discharge surface 311 formed in the bottom of the main body 310 may have a streamlined cross section. The compressed air supplied via the inlet 312 may be discharged to a lower portion of the main body 310. The discharged air may quickly flow along the streamlined discharge surface 311, so that vacuum may be temporally created in a central portion of the main body 310.

Due to the vacuum created in the central portion of the main body 310, negative pressure may be generated in an upward direction, namely, a direction that enables the LED wafer 399 below the main body 310 to be adsorbed toward the main body 310.

In this instance, a single central hole 325 may be formed in a central portion of the guide member 320, excluding a portion facing the discharge surface 311. In other words, a diameter of the central hole 325 may not exceed a circumference of the portion facing the discharge surface 311. For example, when a picker enabling adsorbing of an LED wafer of 150 mm is used, the central hole 325 may desirably have a diameter of 40 mm to 60 mm, and may more desirably have a diameter of 40 mm.

Due to the single central hole 325 formed in the central portion of the guide member 320, a suction force may be increased by at least two-times, compared to a conventional structure in which a plurality of fine holes are formed. Thus, it is possible to easily hold, in the adsorbed state, an LED wafer that is spaced apart by a distance of 5 mm to 10 mm from a bottom of the guide member 320.

In this instance, the compressed air discharged to the lower portion of the main body 310 and flowing along the discharge surface 311 may be enabled to be discharged again toward the upper portion of the main body 310. This is because foreign substances around the LED wafer 399 may be scattered by the compressed air flowing down toward the LED wafer 399, and may be attached to the LED wafer 399, which may cause defects.

Additionally, the LED wafer picker of FIG. 8 may include a support portion 330 disposed in a side of the guide member 320. The support portion 330 may extend laterally from the guide member 320, and may support the LED wafer 399.

The support portion 330 may have a cylindrical shape based on the center of the guide member 320, and may correspond to a size of the LED wafer 399. Additionally, as shown in FIG. 9, a plurality of support portions may be formed in a circumferential direction of the LED wafer 399, to support the LED wafer 399 at a plurality of spots. FIG. 9 illustrates four support portions 330, but there is no limitation to a number of support portions 330. Accordingly, the number of support portions 330 may be appropriately changed based on the size of the LED wafer 399.

Additionally, the main body 310 may include a sensor hole (not shown) into which a sensor is inserted. The sensor hole may be formed in the main body 310 within a range of the diameter of the central hole 325.

As shown in FIG. 11, an inclined taper 331 may be formed in the support portion 330 to have a gradually decreasing diameter toward a lower end of the support portion 330. Additionally, the support portion 330 may include a horizontally extending portion 333, and a bending portion 334. The horizontally extending portion 333 may extend laterally from the guide member 320, and the bending portion 334 may be bent downward from the horizontally extending portion 333. The taper 331 may correspond to an inner surface of the bending portion 334.

The LED wafer 399 may come into contact with the taper 331 and accordingly, a top surface of the LED wafer 399 may be prevented from coming into contact with the guide member 320. Thus, it is possible to prevent a defect from occurring due to a scratch that may be caused by foreign substances attached to the top surface of the LED wafer 399.

The guide member 320 may be integrally coupled to the main body 310. Accordingly, a total number of parts in the LED wafer picker of FIG. 8 may be reduced, and the LED wafer picker of FIG. 8 may be simplified, and thus it is possible to facilitate maintenance of the LED wafer picker of FIG. 8 and to reduce manufacturing costs. In this instance, the guide member 320 may include a bolt hall 329 that enables the guide member 320 to be coupled to the main body 310.

In other words, in the LED wafer picker of FIG. 8, the suction force may be approximately doubled due to the central hole 325 formed in the central portion of the guide member 320. Additionally, the support portion 330 including the taper 331 (FIG. 11) in a lower portion of the guide member 320 may prevent the guide member 320 from coming into contact with the top surface of the LED wafer 399.

Since the support portion 330 extends laterally from the guide member 320, the LED wafer picker of FIG. 8 may be advantageously applied to an LED wafer with a relatively large size of about 6 inches (namely, 150 mm).

Although the LED wafer pickers according to the embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A light-emitting diode (LED) wafer picker, comprising:
   a main body to hold, in an adsorbed state, an LED wafer disposed below the main body, when air drawn in from a top of the LED wafer picker is discharged along a streamlined discharge surface to both sides of the LED wafer picker;
   a guide member to enable the air to flow along the discharge surface, the guide member being disposed below the discharge surface;
   a single central hole formed in a central portion of the guide member, excluding a portion facing the discharge surface; and
   a support portion to support the LED wafer, the support portion extending downward from the guide member, wherein an inclined taper is formed in a lower end of the support portion to have a gradually decreasing diameter toward the lower end of the support portion.

2. The LED wafer picker of claim 1, wherein the main body comprises a sensor hole that is formed in the main body within a range of a diameter of the central hole and into which a sensor is inserted.

* * * * *